United States Patent [19]

Wu et al.

[11] Patent Number: 4,472,210
[45] Date of Patent: Sep. 18, 1984

[54] METHOD OF MAKING A SEMICONDUCTOR DEVICE TO IMPROVE CONDUCTIVITY OF AMORPHOUS SILICON FILMS

[75] Inventors: Chung P. Wu, Mercerville, N.J.; George L. Schnable, Lansdale, Pa.; Roger E. Stricker, Asbury; Bansang W. Lee, Piscataway, both of N.J.

[73] Assignee: RCA Corporation, New York, N.Y.

[21] Appl. No.: 456,493

[22] Filed: Jan. 7, 1983

[51] Int. Cl.³ .................... H01L 21/263; H01L 21/26
[52] U.S. Cl. .................... 148/1.5; 29/576 B; 29/576 T; 148/187; 357/91; 427/86
[58] Field of Search ............... 148/1.5, 187; 29/576 B, 29/576 T; 427/86; 357/91

[56] References Cited

U.S. PATENT DOCUMENTS

| | | | |
|---|---|---|---|
| 4,198,246 | 4/1980 | Wu | 148/1.5 |
| 4,214,917 | 7/1980 | Clark et al. | 148/1.5 |
| 4,214,918 | 7/1980 | Gat et al. | 148/1.5 |
| 4,229,502 | 10/1980 | Wu et al. | 428/446 |
| 4,309,224 | 1/1982 | Shibata | 148/1.5 |
| 4,411,708 | 10/1983 | Winham | 148/1.5 |

OTHER PUBLICATIONS

Lee, J. Electrochem Soc. 129 (Jul. 1982) 1604.
Kishino et al., Appl. Phys. Letts. 32 (1978) 1.
Andrews, J. M., Jour. Electronics Materials 8 (1979) 227.
Tsuchimoto et al. in Ion Impl'n in Semiconductors Ed. S. Namba, Plenum, N.Y. 1975, p. 605.
Kamins, J. Electrochem. Soc. 127 (1980) 666.

*Primary Examiner*—Upendra Roy
*Attorney, Agent, or Firm*—Birgit E. Morris; Donald S. Cohen

[57] ABSTRACT

In making a semiconductor device wherein a film of a non-single crystalline silicon, such as polycrystalline or amorphous silicon, is deposited on a substrate and then doped, particularly by ion implantation, to make the film conductive, the conductivity of the film is increased by pre-annealing the film at a temperature of 1000° C. to 1200° C. in an inert ambient before doping the film.

10 Claims, No Drawings

METHOD OF MAKING A SEMICONDUCTOR DEVICE TO IMPROVE CONDUCTIVITY OF AMORPHOUS SILICON FILMS

BACKGROUND OF THE INVENTION

The present invention relates to a method of increasing the conductivity of non-single crystalline, silicon films used in making semiconductor devices, and more particularly, to increasing the conductivity of ion-implanted non-single crystalline silicon films.

In the field of semiconductor devices, particularly high-density integrated circuits, the trend has been to the use of polycrystalline silicon as a conductor, such as for making contact to regions in the silicon substrate; as interconnects between various regions of the integrated circuit, and as the gate for MOS field effect transistors. Since polycrystalline silicon itself is not conductive, it is doped with a conductivity modifier, such as boron, arsenic or phosphorus, to make it conductive. The polycrystalline silicon can be doped by either diffusing the conductivity modifier into the polycrystalline silicon film or by ion-implantating followed by annealing. Doping the polycrystalline silicon film by ion-implantation has become more popular than diffusion because it often means fewer processing steps and/or lower processing temperatures. However, it has been found that using ion-implantation for doping polycrystalline silicon films, it is difficult to obtain sheet resistivities below 40–50 ohms/square, which is higher than can be achieved by doping with diffusion. It is believed that this is because a large fraction of the implanted ions diffuse to the polycrystalline silicon grain boundaries upon post-implant annealing, there being trapped and therefore not able to contribute to electrical conducivity. More recently, in many devices and circuit applications, amorphous silicon has come into use as the starting material to form the polycrystalline silicon upon annealing the amorphous silicon and has been found to have the same problem when ion-implanted and annealed.

SUMMARY OF THE INVENTION

We have found that the conductivity of a doped non-single crystalline silicon film can be increased by annealing the film at a temperature of at least about 1000° C. in an inert ambient prior to doping the film.

DETAILED DESCRIPTION OF PREFERRED EMBODIMENTS

In making a semiconductor device which includes a film of a conductive non-single crystalline silicon film, as part of the semiconductor device, the non-single crystalline silicon film is deposited on the substrate of the semiconductor device. The non-single crystalline silicon film is generally deposited as either polycrystalline or amorphous by a chemical vapor deposition process in which the substrate is exposed to a gas containing silicon, such as silane, and heated to a temperature at which the gas reacts to form the silicon which deposits on the substrate. The deposition temperature determines whether the silicon is deposited as polycrystalline or amorphous with polycrystalline films being deposited at temperatures higher than that for depositing amorphous films. For example, in a low-pressure chemical vapor deposition system, polycrystalline silicon films can be deposited at about 620° C. and amorphous silicon films can be deposited at about 560° C. The non-single crystalline silicon film is generally deposited over an insulating film, such as silicon dioxide or silicon nitride, which is on the surface of the single crystalline silicon substrate. However, it can also be deposited in openings in the insulating film to form a contact with the substrate.

After the non-single crystalline silicon film is deposited on the substrate, it is annealed, i.e., heated, at a temperature of at least 1000° C. and preferably at a temperature of between 1000° C. and 1200° C., in an inert ambient. The annealing is carried out for sufficient time to cause growth of the size of the crystals of the silicon. When annealing is a furnace, a time period of about 30 minutes or longer is satisfactory. However, shorter time periods may be satisfactory when using other types of heating which heat up the film much faster. After being annealed, the non-single crystalline silicon film is doped by ion-implanting the desired conductivity modifier, such as ions of boron, arsenic or phosphorus, into the film. After being doped by ion implantation, the film is again annealed at a temperature of between 600° C. and 1100° C. and preferably at a temperature of between 850° C. and 950° C. The non-single crystalline film can be defined to the desired shape, such as an interconnect, gate of a MOS field effect transistor or contact to the substrate, either before or after being doped. However, it is generally defined prior to being doped.

We have found that the ion-implanted non-single crystalline silicon films which are pre-annealed, i.e., annealed before doping, have a lower resistivity than films containing the same concentration of the conductivity modifier but are not pre-annealed. We believe that the pre-annealing step enlarges the size of the grains of the non-single crystalline silicon film so that there are fewer grain boundaries to trap the implanted ions and the implanted ions have to diffuse a longer distance during post-implant annealing to become trapped at the grain boundaries.

The following examples are given to further illustrate the method of the present invention and are not to be taken in any way as restricting the invention beyond the scope of the appended claims.

EXAMPLE I

A group of single crystalline silicon wafers having a 0.5 micrometer thick film of silicon dioxide on a surface thereof was coated over the silicon dioxide film with a 0.5 micrometer thick film of polycrystalline silicon. The polycrystalline silicon films were deposited by low-pressure chemical vapor deposition from silane at 620° C. Except for some control wafers, the coated wafers were pre-annealed at temperatures ranging from 1000° C. to 1200° C. for 30 minutes in dry nitrogen.

All of the coated wafers were subjected to an ion implantation of phosphorus ions into the polycrystalline silicon film at 50 KeV with a fluence of $10^{16}$ ions/cm$^2$. All of the doped polycrystalline silicon layers were coated with a 0.5 micrometer capping film of silicon dioxide by chemical vapor deposition from silane and oxygen at 450° C. The wafers were then annealed at 950° C. for 30 minutes to activate the implanted ions. The silicon dioxide capping films were then stripped using buffered hydrofluoric acid and the sheet resistivities of the doped polycrystalline silicon films were measured using 4-point probes. Table I shows the average sheet resistivities for the controls, which were not pre-annealed, and each of the groups which were pre-annealed at different temperatures.

TABLE I

| Pre-Anneal Temperature (°C.) | Resistivity (ohms/square) |
| --- | --- |
| Control | 48.6 ± 2.2 |
| 1000 | 44.1 ± 0.7 |
| 1050 | 43.1 ± 0.7 |
| 1100 | 34.3 ± 0.8 |
| 1150 | 26.9 ± 1.2 |
| 1200 | 22.3 ± 0.1 |

EXAMPLE II

A group of doped polycrystalline silicon films on substrates of single crystalline silicon was made in the same manner as described in Example I except that the polycrystalline silicon films were doped by ion implanting with boron ions at 50 KeV with a fluence of $6 \times 10^{15}$ ions/cm$^2$. Table II shows the average sheet resistivities of the controls which were not pre-annealed, and each of the groups which were pre-annealed at different temperatures.

TABLE II

| Pre-Anneal Temperature (°C.) | Resistivity (ohms/square) |
| --- | --- |
| Control | 87.5 ± 0.7 |
| 1000 | 82.5 ± 1.8 |
| 1050 | 63.1 ± 0.5 |
| 1100 | 45.1 ± 0.1 |
| 1150 | 36.8 ± 0.2 |
| 1200 | 33.5 ± 0.1 |

EXAMPLE III

A group of single crystalline silicon wafers having a 0.5 micrometer thick film of silicon dioxide on a surface thereof was coated over the silicon dioxide film with a 0.5 micrometer thick film of amorphous silicon. The amorphous silicon films were deposited by low-pressure chemical vapor deposition from silane at 560° C. Except for the control wafers which were not pre-annealed, some of the coated wafers were pre-annealed at 1000° C. and some were pre-annealed at 1100° C., all for 30 minutes in dry nitrogen. All of the coated wafers were subjected to an ion implantation of phosphorus ions at 50 KeV with a fluence of $10^{16}$ ions/cm$^2$. All of the doped amorphous silicon layers were coated with a 0.5 micron capping film of silicon dioxide by chemical vapor deposition from silane and oxygen at 450° C. The wafers were annealed at 950° C. for 30 minutes to activate the implanted ions. The silicon dioxide capping films were then stripped using buffered hydrofluoric acid and the sheet resistivities of the doped amorphous silicon films were measured using 4-point probes. Table III shows the average sheet resistivities for the controls which were not pre-annealed, and each of the groups which were pre-annealed at different temperatures.

TABLE III

| Pre-Annual Temperature (°C.) | Resistivity (ohms/square) |
| --- | --- |
| Control | 61.6 ± 0.3 |
| 1000 | 59.2 ± 0.9 |
| 1100 | 42.1 ± 0.4 |

EXAMPLE IV

A group of doped amorphous silicon films on substrates of single crystalline silicon was made in the same manner as described in Example III except that the amorphous films were doped by ion implantation with boron atoms at 50 KeV, with a fluence of $6 \times 10^{15}$ ions/cm$^2$. Table IV shows the average sheet resistivities of the controls, which were not pre-annealed, and each of the groups which were pre-annealed at different temperatures.

TABLE IV

| Pre-Annual Temperature (°C.) | Resistivity (ohms/square) |
| --- | --- |
| Control | 76.0 ± 0.6 |
| 1000 | 72.9 ± 0.4 |
| 1100 | 52.0 ± 0.3 |

From the Tables in the above Examples, it can be seen that pre-annealing the non-single crystalline silicon films prior to ion implantation decreases the resistivity of the ion-implanted films, with the amount of the decrease in resistivity increasing at higher pre-annealing temperatures. For the polycrystalline silicon films shown in Tables I and II, the resistivity decreased 6% to 9% at the 1000° C. pre-annealing temperature, 30% to 48% at a 1100° C. pre-annealing temperature, and over 50% at 1200° C. pre-annealing temperature. For the doped amorphous silicon films shown in Tables III and IV, the resistivity decreased from 4% at 1000° C. to 32% at 1100° C. Although increasing the temperature and/or time of the pre-annealing will increase the conductivity of the resultant doped film, the temperature and time used will be determined by the equipment used during the processing of the semiconductor device and the temperature that the particular device can tolerate without adversely affecting the circuit being formed in the wafer. However, this process not only decreases the resistivity of the doped non-single crystalline film so as to improve its conductivity, but also is simple to incorporate into many integrated circuit processes since it only requires an additional heating step and uses equipment which is generally used for other processing of integrated circuits.

We claim:

1. A method of forming a conductive film of polycrystalline silicon comprising the steps of
    depositing a film of amorphous silicon,
    annealing said amorphous silicon film at a temperature of at least 1000° C. in an inert ambient, and
    doping said annealed film with a conductivity modifier to make the film conductive.
2. A method in accordance with claim 1 wherein the film is annealed at a temperature of between 1000° C. and 1200° C. before doping the film.
3. A method in accordance with claim 1 wherein after the film is annealed, the film is doped by ion implantion.
4. A method in accordance with claim 3 wherein the ions implanted in the film are selected from the group consisting of boron, arsenic and phosphorus.
5. A method in accordance with claim 3 in which after the ions are implanted in the film the doped film is annealed at a temperature of between 600° C. and 1100° C.
6. A method in accordance with claim 5 in which the undoped film is annealed at a temperature of between 1000° C. and 1200° C.

7. A method of making a semiconductor device which includes the steps of depositing a film of a amorphous silicon on a substrate, annealing said film at a temperature of at least 1000° C. in an inert ambient, and doping said film with a conductivity modifier to make the film conductive.

8. A method in accordance with claim 7 in which said film is doped by implanting ions of the conductivity modifier into the film.

9. A method in accordance with claim 7 in which the undoped film is annealed at a temperature of between 1000° C. and 1200° C.

10. A method in accordance with claim 8 in which the doped film is annealed at a temperature of between 600° C. and 1100° C.

* * * * *